(12) United States Patent
Uejima

(10) Patent No.: US 9,160,397 B2
(45) Date of Patent: Oct. 13, 2015

(54) HIGH-FREQUENCY MODULE

(71) Applicant: Murata Manufacturing Co., Ltd., Nagaokakyo-shi, Kyoto-fu (JP)

(72) Inventor: Takanori Uejima, Nagaokakyo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 270 days.

(21) Appl. No.: 13/780,049

(22) Filed: Feb. 28, 2013

(65) Prior Publication Data

US 2013/0176915 A1 Jul. 11, 2013

Related U.S. Application Data

(63) Continuation of application No. PCT/JP2011/071791, filed on Sep. 26, 2011.

(30) Foreign Application Priority Data

Sep. 29, 2010 (JP) ................................ 2010-218064

(51) Int. Cl.
 H04B 1/48 (2006.01)
 H04B 1/00 (2006.01)
 H03H 9/72 (2006.01)

(52) U.S. Cl.
 CPC .............. *H04B 1/48* (2013.01); *H04B 1/0057* (2013.01); *H03H 9/725* (2013.01)

(58) Field of Classification Search
 None
 See application file for complete search history.

(56) References Cited

U.S. PATENT DOCUMENTS

| 2003/0060172 | A1* | 3/2003 | Kuriyama et al. | 455/90 |
| 2004/0071111 | A1* | 4/2004 | Satoh et al. | 370/329 |
| 2004/0121752 | A1* | 6/2004 | Kushitani et al. | 455/327 |
| 2005/0070332 | A1* | 3/2005 | Yamato | 455/562.1 |
| 2005/0164647 | A1* | 7/2005 | Shamsaifar | 455/77 |
| 2006/0058000 | A1* | 3/2006 | Block et al. | 455/333 |
| 2006/0063489 | A1* | 3/2006 | Akaike et al. | 455/41.2 |
| 2006/0194550 | A1* | 8/2006 | Block et al. | 455/78 |
| 2006/0255886 | A1* | 11/2006 | Ninomiya et al. | 333/204 |
| 2006/0276158 | A1* | 12/2006 | Okabe | 455/333 |
| 2007/0229189 | A1* | 10/2007 | Iwata | 333/133 |
| 2009/0093270 | A1* | 4/2009 | Block et al. | 455/552.1 |
| 2009/0147707 | A1* | 6/2009 | Koga et al. | 370/282 |
| 2010/0038993 | A1* | 2/2010 | Umeda et al. | 310/313 B |

(Continued)

FOREIGN PATENT DOCUMENTS

| JP | 2005-45345 A | 2/2005 |
| JP | 2005-73086 A | 3/2005 |

(Continued)

OTHER PUBLICATIONS

Official Communication issued in International Patent Application No. PCT/JP2011/071791, mailed on Nov. 15, 2011.

*Primary Examiner* — Chirag Shah
*Assistant Examiner* — Suk Jin Kang
(74) *Attorney, Agent, or Firm* — Keating & Bennett, LLP

(57) ABSTRACT

A compact high-frequency module that increases isolation between a transmission-side circuit and a reception-side circuit of a duplexer includes a switch element and duplexers. The duplexers include transmission-side SAW filters and reception-side SAW filters. The transmission-side SAW filters are mounted near one edge of a multilayer body. The reception-side SAW filters are mounted near another edge opposite to the one edge of the multilayer body. The switch element is mounted at the center of the multilayer body.

19 Claims, 6 Drawing Sheets

(56) References Cited

U.S. PATENT DOCUMENTS

2010/0135193 A1* 6/2010 Przadka .................. 370/297
2010/0246151 A1* 9/2010 Furukawa et al. ............ 361/782
2010/0265852 A1* 10/2010 Tikka et al. .................. 370/278
2010/0302976 A1* 12/2010 Tikka ............................ 370/278

FOREIGN PATENT DOCUMENTS

| JP | 2006-246234 A | 9/2006 |
| JP | 2008-10995 A | 1/2008 |
| JP | 2009-531882 A | 9/2009 |
| WO | 03/036806 A1 | 5/2003 |

* cited by examiner

HIGH-FREQUENCY MODULE

BACKGROUND OF THE INVENTION

1. Field of the Invention

The present invention relates to a high-frequency module that transmits and receives a plurality of communication signals by using a common antenna.

2. Description of the Related Art

There have been suggested various types of high-frequency modules that transmit and receive, using a common antenna, a plurality of communication signals utilizing different frequency bands. As an example of such a high-frequency module, the high-frequency module described in Japanese Unexamined Patent Application Publication No. 2008-10995 includes a switch IC, a demultiplexing circuit, and a duplexer.

Here, the demultiplexing circuit is a circuit or circuit element that demultiplexes a plurality of target communication signals, including a transmission signal and a reception signal. Specifically, the demultiplexing circuit is a circuit that demultiplexes a communication signal of GSM (Global System for Mobile Communications) 850 and a communication signal of GSM 900, a communication signal of DCS (Digital Cellular System), and a communication signal of PCS (Personal Communications Services) and a communication signal of a CDMA (Code Division Multiple Access) communication system.

The duplexer is a circuit element that demultiplexes a transmission signal and a reception signal utilizing different frequency bands in a single communication band. For example, the duplexer described in Japanese Unexamined Patent Application Publication No. 2008-10995 is connected to a transmission signal input port, a reception signal output port, and an antenna input/output port (specifically, an antenna input/output port via a switch IC) of a single communication band in the CDMA communication system. The duplexer transmits a transmission signal of the single communication band from the transmission signal input port to the antenna input/output port side, and transmits a reception signal of the single communication band from the antenna input/output port side to the reception signal output port.

As described above, the duplexer demultiplexes a transmission signal and a reception signal in a single communication band. The frequency bands utilized for the transmission signal and the reception signal in the single communication band are relatively close to each other. Thus, duplexers available at present, particularly duplexers that are mounted in high-frequency modules of mobile communication terminals, are constructed by combining a transmission-side SAW (Surface Acoustic Wave) filter whose pass band is a frequency band utilized for a transmission signal, and a reception-side SAW filter whose pass band is a frequency band utilized for a reception signal.

In a duplexer according to the related art, as disclosed in Japanese Unexamined Patent Application Publication No. 2008-10995, a transmission-side SAW filter and a reception-side SAW filter are integrally provided in a single housing.

Thus, in the duplexer according to the related art, a transmission path for a transmission signal (electrode pattern or the like) and a transmission path for a reception signal (electrode pattern or the like) are close to each other. Thus, a high-power transmission signal may leak into the transmission path on the reception signal side, and the isolation between a transmission-side circuit and a reception-side circuit may be degraded.

Also, a further decrease in size may be required for high-frequency modules. The size of each circuit element is an important factor when designing high-frequency modules so as to have a reduced size.

SUMMARY OF THE INVENTION

Preferred embodiments of the present invention provide a compact high-frequency module in which the isolation between a transmission-side circuit and a reception-side circuit of a duplexer is increased.

A high-frequency module according to a preferred embodiment of the present invention includes a switch element that connects a plurality of individual terminals to a common terminal in a switching manner, a duplexer that demultiplexes a transmission signal and a reception signal in a single communication band, and a multilayer body including the switch element and the duplexer mounted on a top surface, electrodes for external connection ports provided on a bottom surface, and electrode patterns defining the high-frequency module provided on inner layers of the multilayer body. The duplexer of the high-frequency module includes a transmission-side filter and a reception-side filter. The transmission-side filter has a pass band which is a frequency band of the transmission signal and an attenuation band which is a frequency band of at least the reception signal. The reception-side filter has a pass band which is a frequency band of the reception signal and an attenuation band which is a frequency band of at least the transmission signal.

The transmission-side filter and the reception-side filter are provided in individual housings. The transmission-side filter and the reception-side filter are separately mounted on the top surface of the multilayer body. The switch element is mounted between a mount position of the transmission-side filter and a mount position of the reception-side filter.

With this configuration, the transmission-side filter and the reception-side filter of the duplexer are not integrated, and are disposed at separate positions on the top surface of the multilayer body, and thus, the distance between the transmission-side filter and the reception-side filter is greater than in a case in which the transmission-side filter and the reception-side filter are integrated. Accordingly, unnecessary electromagnetic coupling and electrostatic coupling between the transmission-side filter and the reception-side filter are significantly reduced or prevented. Furthermore, since the switch element is disposed between the transmission-side filter and the reception-side filter, unnecessary electromagnetic coupling and electrostatic coupling between the transmission-side filter and the reception-side filter are further reduced or prevented. Also, since the transmission-side filter and the reception-side filter are provided in individual housings, the housing of a single circuit element is smaller than that of the duplexer according to the related art. Accordingly, the degree of freedom of selecting a mounting pattern to reduce the size of the high-frequency module is increased.

The electrodes for the external connection ports preferably include an electrode for a transmission signal input port which receives the transmission signal from outside. The transmission-side filter is mounted such that a transmission signal input terminal of the transmission-side filter and the electrode for the transmission signal input port overlap each other at least partially in a plan view of the multilayer body.

With this configuration, an electrode on which the transmission signal input terminal of the transmission-side filter is mounted and which is provided on the top surface of the multilayer body, and the electrode for the transmission signal input port which is provided on the bottom surface of the multilayer body, are disposed at almost the same position in a plan view of the multilayer body. Thus, if routing along a normal stacking direction is performed, the length of an inner-layer transmission electrode pattern connecting the electrode on which the transmission signal input terminal of the transmission-side filter is mounted and the electrode for the transmission signal input port is decreased. Accordingly, the degree to which the transmission electrode pattern is electromagnetically or electrostatically coupled to another electrode pattern, for example, a reception electrode pattern, is significantly reduced.

The electrode on which the transmission signal input terminal of the transmission-side filter is mounted and the electrode for the transmission signal input port are preferably connected to each other via only a via-electrode which extends along the stacking direction of the multilayer body.

With this configuration, the electrode on which the transmission signal input terminal of the transmission-side filter is mounted and the electrode for the transmission signal input port are connected to each other at the shortest distance along the stacking direction. Accordingly, the degree to which the transmission electrode pattern is electromagnetically or electrostatically coupled to another electrode pattern, for example, a reception electrode pattern, is further reduced.

The electrodes for the external connection ports preferably include an electrode for a reception signal output port which outputs the reception signal to the outside. The reception-side filter is mounted such that a reception signal output terminal of the reception-side filter and the electrode for the reception signal output port overlap each other at least partially in a plan view of the multilayer body.

With this configuration, an electrode on which the reception signal output terminal of the reception-side filter is mounted and which is provided on the top surface of the multilayer body, and the electrode for the reception signal output port which is provided on the bottom surface of the multilayer body, are disposed at almost the same position in a plan view of the multilayer body. Thus, if routing along a normal stacking direction is performed, the length of an inner-layer reception electrode pattern connecting the electrode on which the reception signal output terminal of the reception-side filter is mounted and the electrode for the reception signal output port is decreased. Accordingly, the degree to which the reception electrode pattern is electromagnetically or electrostatically coupled to another electrode pattern, for example, a transmission electrode pattern, is significantly reduced.

The electrode on which the reception signal output terminal of the reception-side filter is mounted and the electrode for the reception signal output port preferably are connected to each other via only a via-electrode which extends along the stacking direction of the multilayer body.

With this configuration, the electrode on which the reception signal output terminal of the reception-side filter is mounted and the electrode for the reception signal output port are connected to each other at the shortest distance along the stacking direction. Accordingly, the degree to which the reception electrode pattern is electromagnetically or electrostatically coupled to another electrode pattern, for example, a transmission electrode pattern, is further significantly reduced.

The duplexer preferably includes a plurality of duplexers. A plurality of transmission-side filters defining the individual duplexers preferably are integrally provided in a single housing.

With this configuration, the size can be reduced as compared to a case in which a plurality of transmission-side filters are individually provided.

The duplexer preferably includes a plurality of duplexers. A plurality of reception-side filters defining the individual duplexers preferably are integrally provided in a single housing.

With this configuration, the size can be reduced as compared to a case in which a plurality of reception-side filters are individually provided.

In the high-frequency module, the switch element preferably includes a power supply terminal to which a drive voltage and a control voltage are applied. The transmission-side filter preferably is mounted on an opposite side of the power supply terminal with respect to the switch element.

With this configuration, the distance between the transmission-side filter and the power supply terminal of the switch element is increased, and thus, the degree with which a high-power transmission signal which has leaked from the transmission-side filter is input to the power supply terminal of the switch element is significantly reduced. Accordingly, superimposition of a transmission signal on a drive voltage and a control voltage of the switch element is significantly reduced or prevented, and degradation of the characteristic of the switch element is significantly reduced or prevented.

In a high-frequency module according to a preferred embodiment of the present invention, a circuit element preferably is mounted on the top surface of the multilayer body, the circuit element being an element which is different from the switch element, and the transmission-side filter and the reception-side filter included in the duplexer. The circuit element is mounted between a mount position of the switch element and a mount position of the transmission-side filter.

With this configuration, the switch element and the reception-side filter are mounted with respect to the mount position of the transmission-side filter, with the circuit element therebetween. Accordingly, the isolation between the transmission-side filter and the switch element can be increased, as well as the isolation between the transmission-side filter and the reception-side filter.

According to various preferred embodiments of the present invention, a compact high-frequency module is provided in which the isolation between a transmission-signal-side circuit and a reception-side circuit in one communication band is increased.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

A high-frequency module according to a first preferred embodiment of the present invention will be described with reference to the drawings. Description will be provided of a high-frequency module that performs transmission and reception of a communication signal of GSM 900, a communication signal of GSM 1800, and a communication signal of GSM 1900, and transmission and reception in three types of communication bands of a W-CDMA (Wideband Code Division Multiple Access) communication system, i.e., that performs transmission and reception of six types of communication signals. An example of the three types of communication bands of W-CDMA is a combination of BAND 1, BAND 2, and BAND 5. Here, transmission/reception circuits of GSM 900, GSM 1800, and GSM 1900 can be omitted. Also, the number of transmissions and receptions in a communication system other than the GSM communication signals is not limited to three.

In the following description, a switch IC is used as an example of a switch element. Alternatively, a switch element having another structure can be used.

Figure 1:
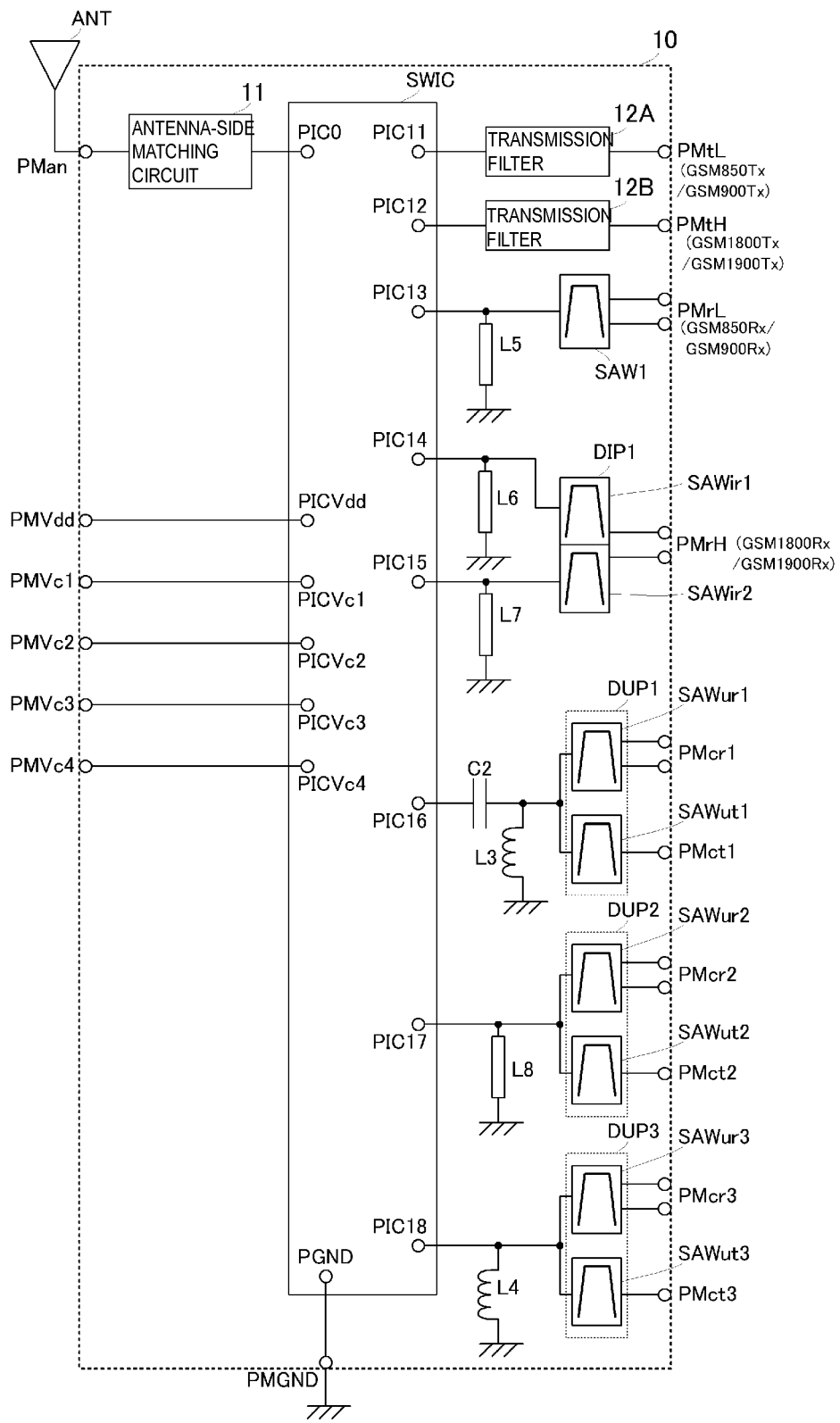
FIG. 1 is a block diagram illustrating the circuit configuration of a high-frequency module according to a first preferred embodiment of the present invention.

First, the circuit configuration of a high-frequency module 10 according to the present preferred embodiment will be described. FIG. 1 is a block diagram illustrating the circuit configuration of the high-frequency module 10 according to this preferred embodiment.

A switch element SWIC includes a single common terminal PIC0 and eight individual terminals PIC11 to PIC18. The switch element SWIC includes a ground terminal PGND to be connected to a ground GND. The ground terminal PGND is connected to a ground port electrode PMGND for external connection of the high-frequency module 10.

The switch element SWIC includes a drive voltage application terminal PICVdd, and a plurality of control voltage application terminals PICVc1, PICVc2, PICVc3, and PICVc4. The drive voltage application terminal PICVdd is connected to a power supply port electrode PMVdd for external connection of the high-frequency module 10. The control voltage application terminals PICVc1, PICVc2, PICVc3, and PICVc4 are connected to power supply port electrodes PMVc1, PMVc2, PMVc3, and PMVc4 for external connection of the high-frequency module 10, respectively.

The switch element SWIC is driven by a drive voltage Vdd applied from the drive voltage application terminal PICVdd. In the switch element SWIC, a combination of control voltages Vc1, Vc2, Vc3, and Vc4 applied to the plurality of control voltage application terminals PICVc1, PICVc2, PICVc3, and PICVc4 causes the single common terminal PIC0 to be connected to any one of the eight individual terminals PIC11 to PIC18.

The common terminal PIC0 is connected to a port electrode PMan for external connection of the high-frequency module 10, via an antenna-side matching circuit which also defines and functions as an ESD circuit. The port electrode PMan is connected to an external antenna ANT.

The first individual terminal PIC11 is connected to a port electrode PMtL for external connection of the high-frequency module 10, via a transmission-side filter 12A. The port electrode PMtL is a port to which a transmission signal of GSM 850 or a transmission signal of GSM 900 is input from the outside. The transmission-side filter 12A is a filter circuit which attenuates a second harmonic and a third harmonic of a transmission signal of GSM 850 and a transmission signal of GSM 900 and whose pass band is the frequency band utilized for the transmission signal of GSM 850 and the transmission signal of GSM 900.

The second individual terminal PIC12 is connected to a port electrode PMtH for external connection of the high-frequency module 10, via a transmission-side filter 12B. The port electrode PMtH is a port to which a transmission signal of GSM 1800 or a transmission signal of GSM 1900 is input from the outside. The transmission-side filter 12B is a filter circuit which attenuates a second harmonic and a third harmonic of a transmission signal of GSM 1800 and a transmission signal of GSM 1900 and whose pass band is the frequency band utilized for the transmission signal of GSM 1800 and the transmission signal of GSM 1900.

The third individual terminal PIC13 is connected to one end of a SAW filter SAW1. A matching inductor L5 is connected between a ground potential and a transmission line which connects the third individual terminal PIC13 and the SAW filter SAW1. The SAW filter SAW1 is a filter whose pass band is the frequency band of a reception signal of GSM 900, and has a balanced-unbalanced transforming function. The other end of the SAW filter SAW1 is a balanced terminal and is connected to a port electrode PMrL for external connection of the high-frequency module 10.

The fourth individual terminal PIC14 is connected to one end of a SAW filter SAWir1 of a diplexer DIP1. A matching inductor L6 is connected between the ground potential and a transmission line which connects the fourth individual terminal PIC14 and the SAW filter SAWir1. The SAW filter SAWir1 is a filter whose pass band is the frequency band of a reception signal of GSM 1800, and has a balanced-unbalanced transforming function.

The fifth individual terminal PIC15 is connected to one end of a SAW filter SAWir2 of the diplexer DIP1. A matching inductor L7 is connected between the ground potential and a transmission line which connects the fifth individual terminal PIC15 and the SAW filter SAWir2. The SAW filter SAWir2 is a filter whose pass band is the frequency band of a reception signal of GSM 1900, and has a balanced-unbalanced transforming function.

The SAW filters SAWir1 and SAWir2 are integrally provided so as to define the single diplexer DIP1. The SAW filters SAWir1 and SAWir2 of the diplexer DIP1 have a common balanced terminal. The common balanced terminal is connected to a port electrode PMrH for external connection of the high-frequency module 10. The reception signal of GSM 1800 and the reception signal of the GSM 1900 are output from the port electrode PMrH to the outside.

The sixth individual terminal PIC16 is connected to a duplexer DUP1. A capacitor C2 is connected between the sixth individual terminal PIC16 and the duplexer DUP1, and an inductor L3 is connected between the ground potential and the duplexer DUP1 side of the capacitor C2. The capacitor C2 and the inductor L3 define a matching circuit.

The duplexer DUP1 includes a SAW filter SAWut1 and a SAW filter SAWur1. The sixth individual terminal PIC16 is connected to both of one end of the SAW filter SAWut1 and one end of the SAW filter SAWur1.

The SAW filter SAWut1, which corresponds to the transmission-side filter according to this preferred embodiment of the present invention, has a pass band which is a frequency band utilized for a transmission signal of a first communication signal, and has an attenuation band which is a frequency band utilized for a reception signal of the first communication signal. The other end of the SAW filter SAWut1 is connected to a port electrode PMct1 for external connection of the high-frequency module 10. The port electrode PMct1 is a port to which a first transmission signal is input from the outside.

The SAW filter SAWur1, which corresponds to the reception-side filter according to the present preferred embodiment of the present invention, has a pass band which is a frequency band utilized for a reception signal of the first communication signal, and has an attenuation band which is a frequency band utilized for a transmission signal of the first communication signal. The SAW filter SAWur1 has a balanced-unbalanced transforming function. The other end of the SAW filter SAWur1 is a balanced terminal, and is connected to a port electrode PMcr1 for external connection of the high-frequency module 10. The port electrode PMcr1 is a port from which a first reception signal is output to the outside.

The SAW filter SAWut1 and the SAW filter SAWur1 of the duplexer DUP1 are defined by circuit elements having individual housings. The SAW filter SAWut1 and the SAW filter SAWur1 are disposed so as to be separated from each other. The details will be described below.

The seventh individual terminal PIC17 is connected to a duplexer DUP2. A matching inductor L8 is connected between the ground potential and a transmission line which connects the seventh individual terminal PIC17 and the duplexer DUP2.

The duplexer DUP2 includes a SAW filter SAWut2 and a SAW filter SAWur2. The seventh individual terminal PIC17 is connected to both of one end of the SAW filter SAWut2 and one end of the SAW filter SAWur2.

The SAW filter SAWut2, which corresponds to the transmission-side filter according to the present preferred embodiment of the present invention, has a pass band which is a frequency band utilized for a transmission signal of a second communication signal, and has an attenuation band which is a frequency band utilized for a reception signal of the second communication signal. The other end of the SAW filter SAWut2 is connected to a port electrode PMct2 for external connection of the high-frequency module 10. The port electrode PMct2 is a port to which a second transmission signal is input from the outside.

The SAW filter SAWur2, which corresponds to the reception-side filter according to the present preferred embodiment of the present invention, has a pass band which is a frequency band utilized for a reception signal of the second communication signal, and has an attenuation band which is a frequency band utilized for a transmission signal of the second communication signal. The SAW filter SAWur2 has a balanced-unbalanced transforming function. The other end of the SAW filter SAWur2 is a balanced terminal, and is connected to a port electrode PMcr2 for external connection of the high-frequency module 10. The port electrode PMcr2 is a port from which a second reception signal is output to the outside.

The SAW filter SAWut2 and the SAW filter SAWur2 of the duplexer DUP2 are defined by circuit elements having individual housings. The SAW filter SAWut2 and the SAW filter SAWur2 are disposed so as to be separated from each other. The details will be described below.

The eighth individual terminal PIC18 is connected to a duplexer DUP3. A matching inductor L4 is connected between the ground potential and a transmission line which connects the eighth individual terminal PIC17 and the duplexer DUP3.

The duplexer DUP3 includes a SAW filter SAWut3 and a SAW filter SAWur3. The eighth individual terminal PIC18 is connected to both of one end of the SAW filter SAWut3 and one end of the SAW filter SAWur3.

The SAW filter SAWut3, which corresponds to the transmission-side filter according to the present preferred embodiment of the present invention, has a pass band which is a frequency band utilized for a transmission signal of a third communication signal, and has an attenuation band which is a frequency band utilized for a reception signal of the third communication signal. The other end of the SAW filter SAWut3 is connected to a port electrode PMct3 for external connection of the high-frequency module 10. The port electrode PMct3 is a port to which a third transmission signal is input from the outside.

The SAW filter SAWur3, which corresponds to the reception-side filter according to the present preferred embodiment of the present invention, has a pass band which is a frequency band utilized for a reception signal of the third communication signal, and has an attenuation band which is a frequency band utilized for a transmission signal of the third communication signal. The SAW filter SAWur3 has a balanced-unbalanced transforming function. The other end of the SAW filter SAWur3 is a balanced terminal, and is connected to a port electrode PMcr3 for external connection of the high-frequency module 10. The port electrode PMcr3 is a port from which a third reception signal is output to the outside.

The SAW filter SAWut3 and the SAW filter SAWur3 of the duplexer DUP3 are defined by circuit elements having individual housings. The SAW filter SAWut3 and the SAW filter SAWur3 are disposed so as to be separated from each other. The details will be described below.

Figure 2A:
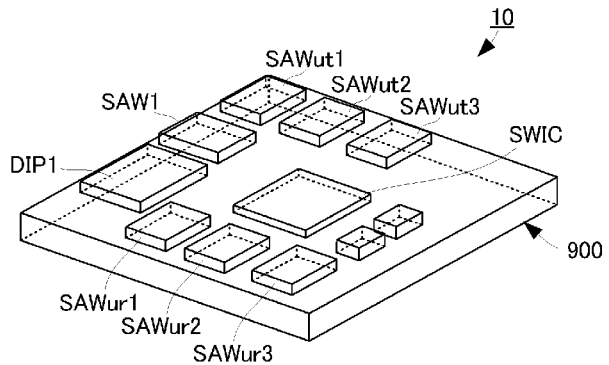
FIGS. 2A to 2C include an external perspective view, a top view illustrating a mounting layout, and a diagram illustrating an arrangement pattern of terminals of a switch element, for describing the structure of the high-frequency module according to the first preferred embodiment of the present invention.
Figure 2B:
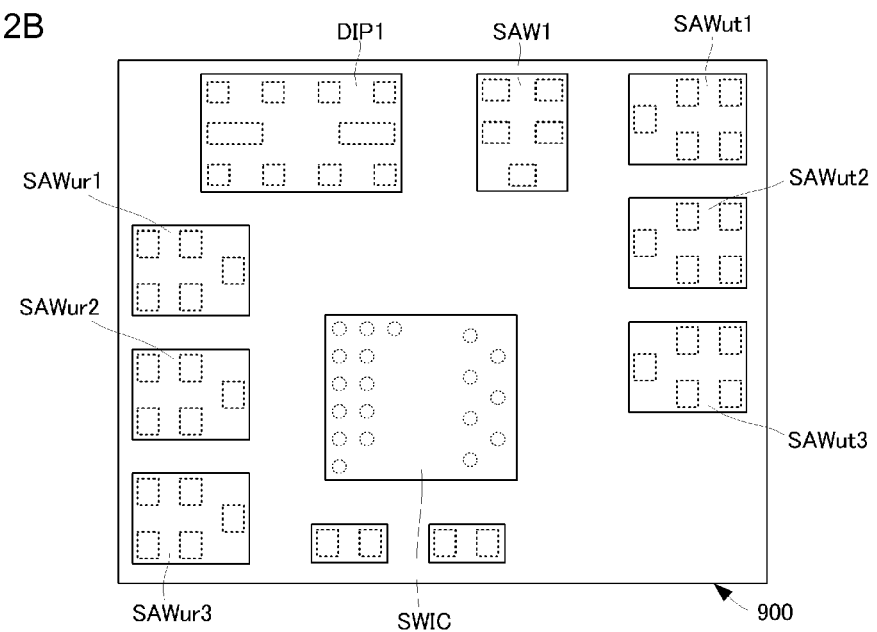
Figure 2C:
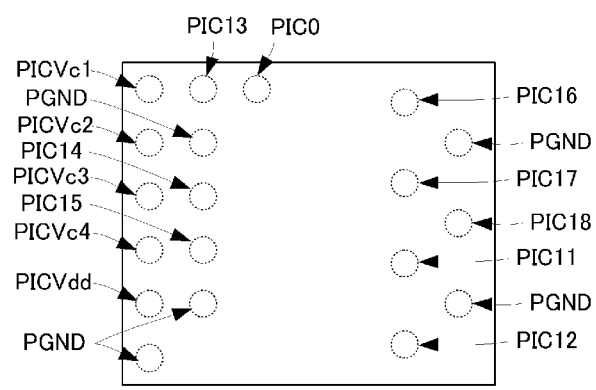

Next, description will be given of the structure of the high-frequency module 10 having the above-described circuit configuration. FIGS. 2A to 2C include diagrams illustrating the structure of the high-frequency module 10 according to this preferred embodiment. FIG. 2A is an external perspective view, FIG. 2B is a top view illustrating a mounting layout, and FIG. 2C is a diagram illustrating an arrangement pattern of terminals of the switch element SWIC.

The high-frequency module 10 includes a multilayer body 900 and circuit elements which are mounted on the top surface of the multilayer body 900 and which will be described below.

The multilayer body 900 includes a desired number of dielectric layers which are stacked, and inner-layer electrodes, and includes an electrode pattern defining the high-frequency module 10 except for the circuit elements described below. Although not specifically illustrated in this preferred embodiment, the above-described port electrodes for external connection are formed on the bottom surface of the multilayer body 900 in accordance with a certain arrangement.

The circuit elements mounted on the top surface of the multilayer body 900 include the switch element SWIC, the SAW filter SAW1, the diplexer DIP1, the SAW filters SAWut1 and SAWur1 of the duplexer DUP1, the SAW filters SAWut2 and SAWur2 of the duplexer DUP2, and the SAW filters SAWut3 and SAWur3 of the duplexer DUP3.

In this case, the SAW filters SAWut1 and SAWur1 of the duplexer DUP1 are circuit elements having individual housings. Likewise, the SAW filters SAWut2 and SAWur2 of the duplexer DUP2 are circuit elements having individual housings. Also, the SAW filters SAWut3 and SAWur3 of the duplexer DUP3 are circuit elements having individual housings.

Furthermore, the circuit elements include the inductor and other elements defining the above-described matching circuit.

The SAW filter SAWut1 of the duplexer DUP1, the SAW filter SAWut2 of the duplexer DUP2, and the SAW filter SAWut3 of the duplexer DUP3 are mounted along and adjacent to one edge of the multilayer body 900 in a plan view.

The SAW filter SAWur1 of the duplexer DUP1, the SAW filter SAWur2 of the duplexer DUP2, and the SAW filter SAWur3 of the duplexer DUP3 are mounted along and adjacent to another edge opposite to the one edge of the multilayer body 900 in a plan view.

With this configuration, the SAW filter SAWut1 and the SAW filter SAWur1 of the duplexer DUP1 are separated from each other. Accordingly, unnecessary electromagnetic coupling and electrostatic coupling between the SAW filters SAWut1 and SAWur1 are significantly reduced or prevented, and the isolation therebetween is increased. That is, the characteristic of the duplexer DUP1 is improved without causing leakage of a transmission signal of a high-power first communication signal to the SAW filter SAWur1 side.

Likewise, the SAW filter SAWut2 and the SAW filter SAWur2 of the duplexer DUP2 are separated from each other, and the SAW filter SAWut3 and the SAW filter SAWur3 of the duplexer DUP3 are separated from each other. Accordingly, unnecessary electromagnetic coupling and electrostatic coupling between the SAW filters SAWut2 and SAWur2 and between the SAW filters SAWut3 and SAWur3 are significantly reduced or prevented, and the isolation therebetween is increased. That is, the characteristic of the duplexer DUP2 can be improved without causing leakage of a transmission signal of a high-power second communication signal to the SAW filter SAWur2 side. Also, the characteristic of the duplexer DUP3 is improved without causing leakage of a transmission signal of a high-power third communication signal to the SAW filter SAWur3 side.

Furthermore, the switch element SWIC is mounted at the center of the multilayer body 900 in a plan view. In other words, the switch element SWIC is mounted between a mount region of the SAW filters SAWut1, SAWut2, and SAWut3 of the duplexers DUP1, DUP2, and DUP3 and a mount region of the SAW filters SAWur1, SAWur2, and SAWur3 of the duplexers DUP1, DUP2, and DUP3. Accordingly, unnecessary electromagnetic coupling and electrostatic coupling between the SAW filters SAWut1 and SAWur1 of the duplexer DUP1 are further significantly reduced or prevented. Also, unnecessary electromagnetic coupling and electrostatic coupling between the SAW filters SAWut2 and SAWur2 of the duplexer DUP2 are further significantly reduced or prevented, and unnecessary electromagnetic coupling and electrostatic coupling between the SAW filters SAWut3 and SAWur3 of the duplexer DUP3 are further significantly reduced or prevented. Particularly, as illustrated in FIG. 2B, the switch element SWIC is disposed along the straight line which connects the SAW filters SAWut2 and SAWur2 of the duplexer DUP2, and along the straight line which connects the SAW filters SAWut3 and SAWur3 of the duplexer DUP3, and thus, the effect of minimizing or preventing unnecessary electromagnetic coupling and electrostatic coupling is increased.

As illustrated in FIGS. 2B and 2C, the switch element SWIC is mounted on the multilayer body 900 such that a power supply terminal group including the drive voltage application terminal PICVdd and the plurality of control voltage application terminals PICVc1, PICVc2, PICVc3, and PICVc4 is disposed on the side of the SAW filters SAWur1, SAWur2, and SAWur3 that function as reception-side filters. In other words, the switch element SWIC is mounted on the multilayer body 900 such that the power supply terminal group is disposed on the opposite side of the SAW filters SAWut1, SAWut2, and SAWut3 that function as transmission-side filters.

With this configuration, the SAW filters SAWut1, SAWut2, and SAWut3 that function as transmission-side filters are separated from the power supply terminal group, and thus a high degree of isolation can be achieved. Therefore, leakage of a high-power transmission signal from the SAW filters SAWut1, SAWut2, and SAWut3 that function as transmission-side filters leaks is significantly reduced or prevented and is superimposed on a drive voltage and a control voltage input to the power supply terminal group. Accordingly, the switch characteristics of the switch element SWIC, such as a harmonic characteristic, are improved.

With the use of the configuration according to this preferred embodiment, the size of the SAW filters SAWut1, SAWut2, SAWut3, SAWur1, SAWur2, and SAWur3 that function as transmission-side filters and reception-side filters is reduced, as compared to the duplexer according to the related art in which a transmission-side filter and a reception-side filter are integrated. Accordingly, the degree of freedom of the arrangement for mounting circuit elements in the high-frequency module 10 is increased, and the size of the high-frequency module 10 is more reliably and easily reduced.

In this preferred embodiment, the diplexer DIP1 and the SAW filter SAW1 are preferably mounted along an edge which is perpendicular or substantially perpendicular to the above-described one edge and the other edge. Alternatively, the diplexer DIP1 and the SAW filter SAW1 may be disposed at other positions depending on the specifications.

Figure 3:
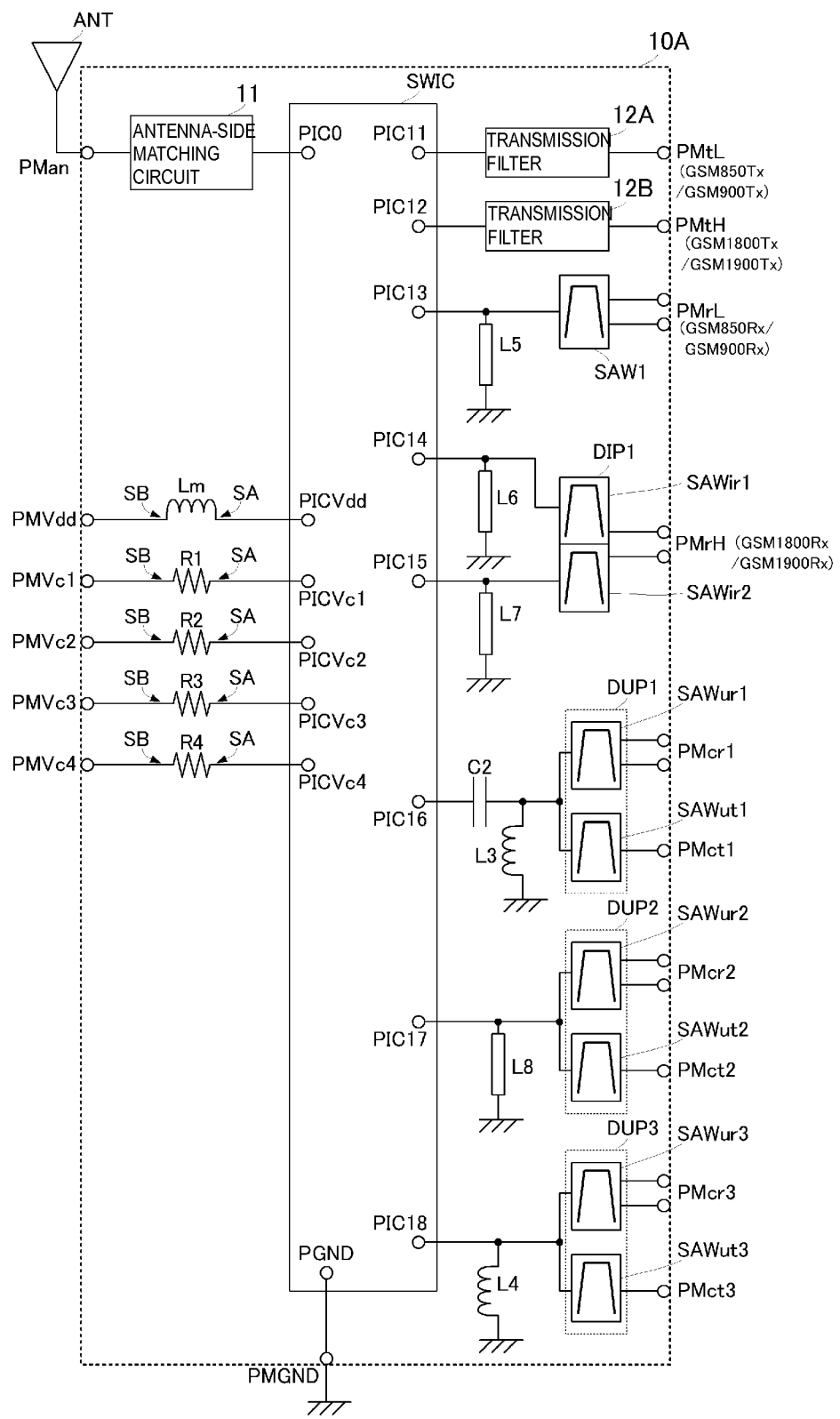
FIG. 3 is a block diagram illustrating the circuit configuration of a high-frequency module according to a second preferred embodiment of the present invention.

Next, a high-frequency module according to a second preferred embodiment of the present invention will be described with reference to the drawings. FIG. 3 is a block diagram illustrating the circuit configuration of a high-frequency module 10A according to this preferred embodiment. As illustrated in FIG. 3, the high-frequency module 10A of this preferred embodiment has the same or substantially the same circuit configuration as that of the high-frequency module 10 of the first preferred embodiment, except that an inductor Lm for reducing noise and resistors R1, R2, R3, and R4 are added to the power supply circuit of the switch element SWIC. Thus, regarding the circuit configuration, only a different portion will be described, and description of the other portions will be omitted.

The inductor Lm is connected between the drive voltage application terminal PICVdd of the switch element SWIC and the power supply port electrode PMVdd for external connection of the high-frequency module 10A.

The resistor R1 is connected between the control voltage application terminal PICVc1 of the switch element SWIC and the power supply port electrode PMVc1 for external connection of the high-frequency module 10A. The resistor R2 is connected between the control voltage application terminal PICVc2 of the switch element SWIC and the power supply port electrode PMVc2 for external connection of the high-frequency module 10A. The resistor R3 is connected between the control voltage application terminal PICVc3 of the switch element SWIC and the power supply port electrode PMVc3 for external connection of the high-frequency module 10A. The resistor R4 is connected between the control voltage application terminal PICVc4 of the switch element SWIC and the power supply port electrode PMVc4 for external connection of the high-frequency module 10A.

Figure 4A:
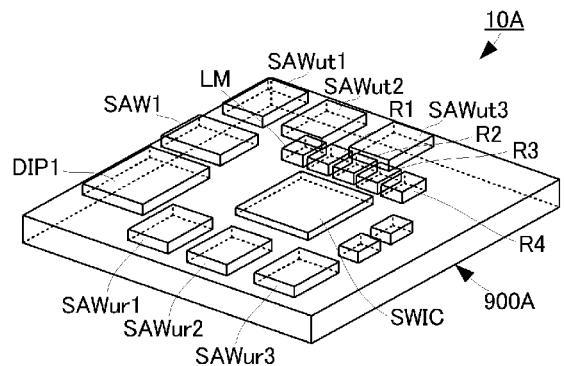
FIGS. 4A to 4C include an external perspective view, a top view illustrating a mounting layout, and a diagram illustrating an arrangement pattern of terminals of a switch element, for describing the structure of the high-frequency module according to the second preferred embodiment of the present invention.
Figure 4B:
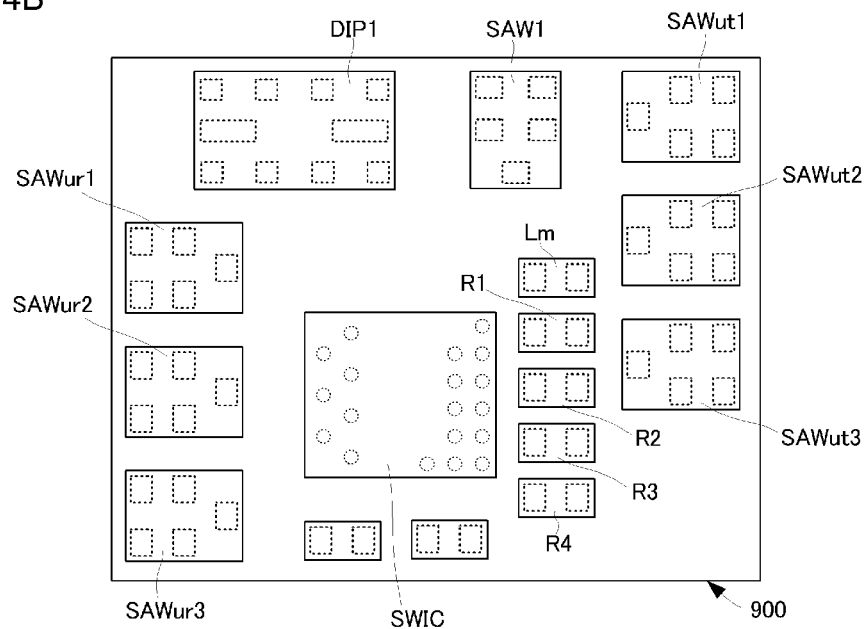
Figure 4C:
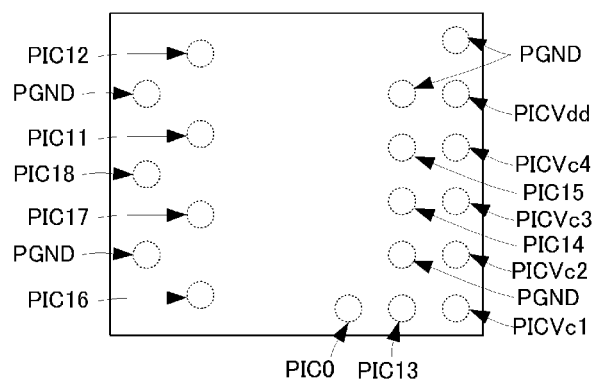
Figure 5:
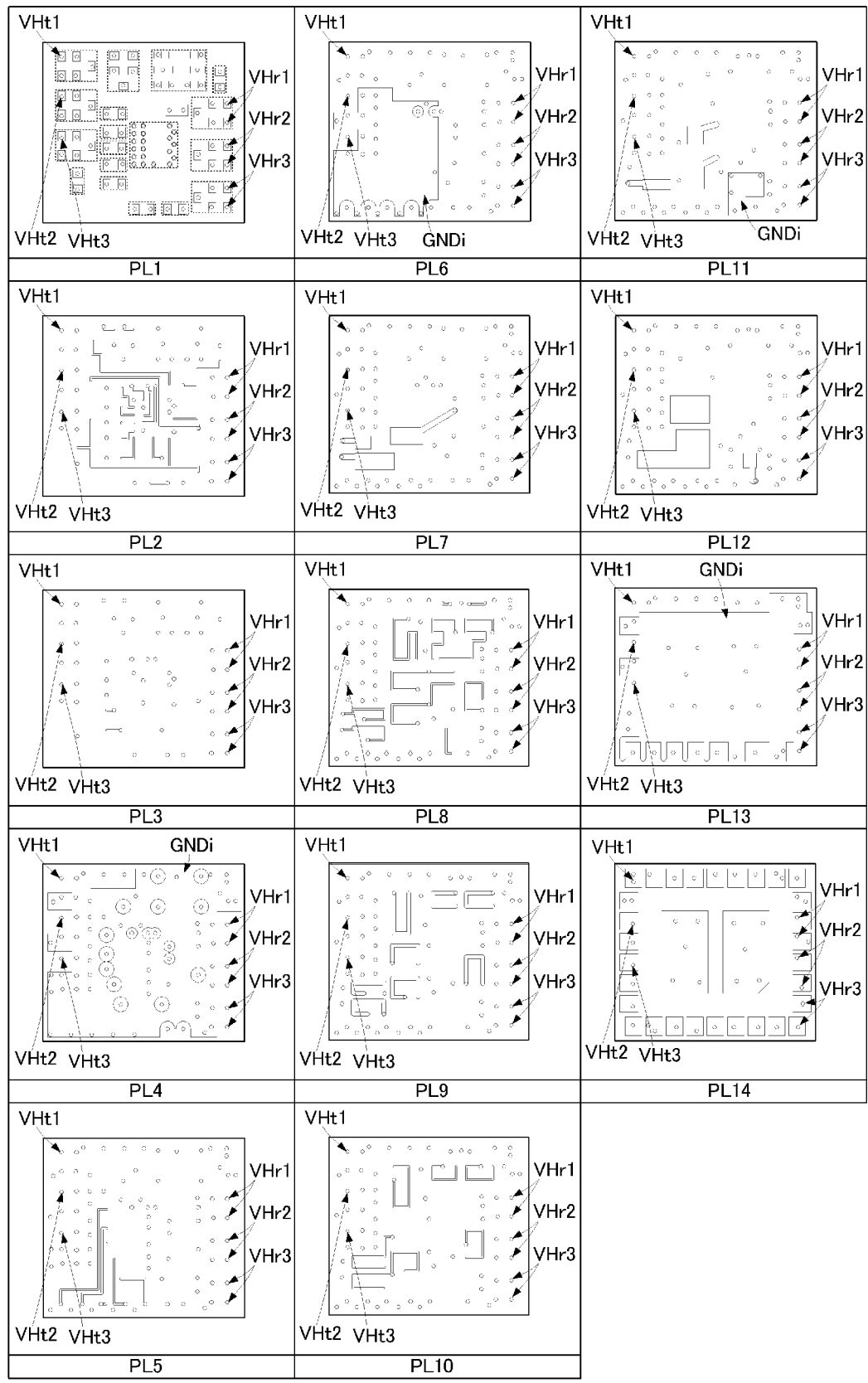
FIG. 5 is a layered view of the high-frequency module of the second preferred embodiment of the present invention.
Figure 6A:
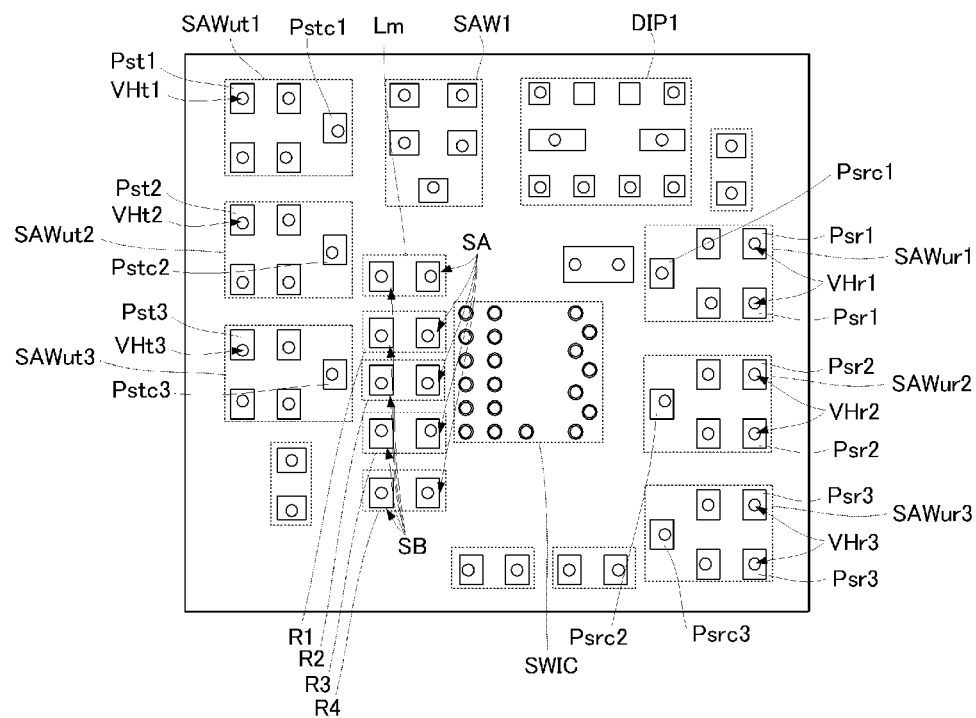
FIGS. 6A and 6B include a diagram illustrating a mount state of a top layer of a multilayer body of the high-frequency module of the second preferred embodiment of the present invention, and a diagram illustrating an arrangement pattern of port electrodes for external connection of a bottom layer of the multilayer body.
Figure 6B:
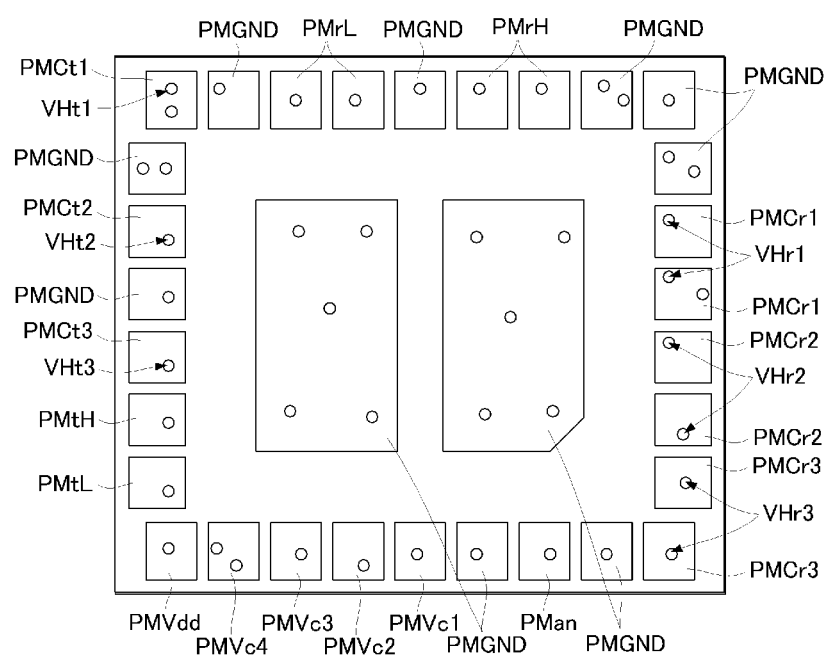

The high-frequency module 10A having such a configuration has the following structure. FIGS. 4A to 4C include diagrams illustrating the structure of the high-frequency module 10A according to this preferred embodiment. FIG. 4A is an external perspective view, FIG. 4B is a top view illustrating a mounting layout, and FIG. 4C is a diagram illustrating an arrangement pattern of terminals of the switch element SWIC. FIG. 5 is a layered view of the high-frequency module 10A of this preferred embodiment. FIG. 5 illustrates the electrode patterns of individual dielectric layers of the multilayer body 900 viewed from the bottom surface side. FIG. 6A is a diagram illustrating a mount state of the top layer of the multilayer body 900 of the high-frequency module 10A of this preferred embodiment, and FIG. 6B is a diagram illustrating an arrangement pattern of port electrodes for external connection of the bottom layer.

As in the high-frequency module 10 of the first preferred embodiment, the individual circuit elements of the switch element SWIC, the SAW filter SAW1, the diplexer DIP1, the SAW filters SAWut1 and SAWur1 of the duplexer DUP1, the SAW filters SAWut2 and SAWur2 of the duplexer DUP2, the SAW filters SAWut3 and SAWur3 of the duplexer DUP3, and the matching circuit are mounted on the top layer of the multilayer body 900.

Furthermore, in the high-frequency module 10A, the above-described inductor Lm and resistors R1, R2, R3, and R4 are also mounted. The inductor Lm and the resistors R1, R2, R3, and R4 are mounted in an array between the mount position of the switch element SWIC and the mount region of the SAW filters SAWut1, SAWut2, and SAWut3 that functions as transmission-side filters in a plan view of the multilayer body 900.

With this configuration, the isolation between the SAW filters SAWut1, SAWut2, and SAWut3 that function as transmission-side filters and the SAW filters SAWur1, SAWur2, and SAWur3 that function as reception-side filters is further increased. Furthermore, the isolation between the SAW filters SAWut1, SAWut2, and SAWut3 that function as transmission-side filters and the switch element SWIC is further increased.

In this case, in the switch element SWIC, even if the SAW filters SAWut1, SAWut2, and SAWut3 that function as transmission-side filters function as a power supply terminal group, isolation can be achieved by arranging the inductor Lm and the resistors R1, R2, R3, and R4 between the switch element SWIC and the transmission-side filter group, and superimposition of a transmission signal on a drive voltage and a control voltage is significantly reduced or prevented.

Furthermore, as illustrated in FIGS. 3 and 6, the inductor Lm and the resistors R1, R2, R3, and R4 are mounted such that the terminals of the inductor Lm and the resistors R1, R2, R3, and R4 on the side connected to the port electrodes for external connection (on the side of "SB" in FIGS. 3, 6A, and 6B are oriented to the side of the mount region of the transmission-side filter group. Accordingly, isolation is increased with further reliably, and superimposition of a transmission signal on a drive voltage and a control voltage is significantly reduced or prevented.

Next, the internal structure, the mount pattern of the top surface, and the arrangement pattern of the port electrodes for external connection of the bottom surface of the multilayer body 900 will be described with reference to FIGS. 5, 6A, and 6B.

The multilayer body 900 includes fourteen dielectric layers which are stacked. In the individual dielectric layers, electrode patterns which define the high-frequency module 10A are provided, and via-electrodes for interlayer connection are provided. The via-electrodes are represented by circles shown in the individual layers in FIG. 5. Hereinafter, description will be provided under the assumption that the top layer is regarded as the first layer, the layer number increases toward the bottom side, and the bottom layer is regarded as the fourteenth layer.

Element mounting electrodes to mount individual circuit elements are provided on the top surface of the first layer, which is the top layer, that is, on the top surface of the multilayer body 900, as described above.

Routing pattern electrodes are provided in the second and third layers. An inner-layer ground electrode GNDi is provided over substantially the entire region of the fourth layer. Routing electrodes are provided in the fifth layer. An inner-layer ground electrode GNDi is provided in a region of the sixth layer.

Inductor electrode patterns and capacitor electrode patterns defining the transmission-side filters 12A and 12B and the antenna-side matching circuit 11 are provided in the seventh, eighth, ninth, tenth, eleventh, and twelfth layers.

An inner-layer ground electrode GNDi is provided over substantially the entire region of the thirteenth layer.

The port electrodes for external connection are arranged on the bottom surface of the fourteenth layer, which is the bottom layer, that is, on the bottom surface of the multilayer body 900. As illustrated in FIGS. 6A and 6B, the port electrode PMct1 arranged to input a first transmission signal, the port electrode PMct2 arranged to input a second transmission signal, the port electrode PMct3 arranged to input a third transmission signal, the port electrode PMtH arranged to input a transmission signal of GSM 1800/1900, and the port electrode PMtL arranged to input a transmission signal of GSM 850/900 are arranged along one edge of the fourteenth layer corresponding to one edge on the side on which the SAW filters SAWut1, SAWut2, and SAWut3 that function as transmission-side filters are mounted.

In this case, the port electrode PMct1 arranged to input the first transmission signal and a mount electrode Pst1 for a transmission signal input terminal of the SAW filter SAWut1 are arranged so as to be at least partially overlapped with each other in a plan view of the multilayer body 900. The port electrode PMct1 and the mount electrode Pst1 are connected to each other via only a via-electrode VHt1. With this configuration, the port electrode PMct1 and the mount electrode Pst1 are connected to each other at the shortest distance along the stacking direction, and thus, unnecessary electromagnetic coupling and electrostatic coupling are less likely to occur with respect to another circuit element.

Also, the port electrode PMct2 arranged to input the second transmission signal and a mount electrode Pst2 for a transmission signal input terminal of the SAW filter SAWut2 are arranged so as to be at least partially overlapped each other in a plan view of the multilayer body 900. The port electrode PMct2 and the mount electrode Pst2 are connected to each other via only a via-electrode VHt2. With this configuration, the port electrode PMct2 and the mount electrode Pst2 are connected to each other at the shortest distance along the stacking direction, and thus, unnecessary electromagnetic coupling and electrostatic coupling are less likely to occur with respect to another circuit element.

Also, the port electrode PMct3 arranged to input the third transmission signal and a mount electrode Pst3 for a transmission signal input terminal of the SAW filter SAWut3 are arranged so as to be at least partially overlapped each other in a plan view of the multilayer body 900. The port electrode PMct3 and the mount electrode Pst3 are connected to each other via only a via-electrode VHt3. With this configuration, the port electrode PMct3 and the mount electrode Pst3 are connected to each other at the shortest distance along the stacking direction, and thus, unnecessary electromagnetic coupling and electrostatic coupling are less likely to occur with respect to another circuit element.

The via-electrodes VHt1, VHt2, and VHt3 are relatively close to each other and extend in parallel or substantially in parallel with each other. As shown in the fourth layer and the thirteenth layer in FIG. 5, the inner-layer ground electrodes GNDi are interposed between the via-electrodes, and thus, unnecessary electromagnetic coupling and electrostatic coupling therebetween are also significantly reduced or prevented.

Also, the port electrode PMcr1 arranged to output a first reception signal, the port electrode PMcr2 arranged to output a second reception signal, and the port electrode PMcr3 arranged to output a third reception signal are arranged along another edge of the fourteenth layer corresponding to another edge on the side on which the SAW filters SAWur1, SAWur2, and SAWur3 that function as reception-side filters are mounted.

In this case, the port electrode PMcr1 arranged to output the first reception signal and a mount electrode Psr1 for a reception signal output terminal of the SAW filter SAWur1 are arranged so as to be at least partially overlapped each other in a plan view of the multilayer body 900. The port electrode PMcr1 and the mount electrode Psr1 are connected to each other via only a via-electrode VHr1. With this configuration, the port electrode PMcr1 and the mount electrode Psr1 are connected to each other at the shortest distance along the stacking direction, and thus, unnecessary electromagnetic coupling and electrostatic coupling are less likely to occur with respect to another circuit element. In combination with the above-described configuration in which the port electrode PMct1 provided for the first transmission signal and the mount electrode Pst1 are connected to each other via only the via-electrode VHt1, the transmission circuit and the reception circuit for the first communication signal are greatly separated from each other, and unnecessary electromagnetic coupling and electrostatic coupling are more reliably reduced or prevented. Accordingly, a high degree of isolation is achieved between the transmission circuit and the reception circuit for the first communication signal.

Also, the port electrode PMcr2 arranged to output the second reception signal and a mount electrode Psr2 for a reception signal output terminal of the SAW filter SAWur2 are arranged so as to be at least partially overlapped each other in a plan view of the multilayer body 900. The port electrode PMcr2 and the mount electrode Psr2 are connected to each other via only a via-electrode VHr2. With this configuration, the port electrode PMcr2 and the mount electrode Psr2 are connected to each other at the shortest distance along the stacking direction, and thus, unnecessary electromagnetic coupling and electrostatic coupling are less likely to occur with respect to another circuit element. In combination with the above-described configuration in which the port electrode PMct2 provided for the second transmission signal and the mount electrode Pst2 are connected to each other via only the via-electrode VHt2, the transmission circuit and the reception circuit for the second communication signal are greatly separated from each other, and unnecessary electromagnetic coupling and electrostatic coupling are more reliably reduced or prevented. Accordingly, a high degree of isolation is achieved between the transmission circuit and the reception circuit for the second communication signal.

Also, the port electrode PMcr3 arranged to output the third reception signal and a mount electrode Psr3 for a reception signal output terminal of the SAW filter SAWur3 are arranged so as to be at least partially overlapped each other in a plan view of the multilayer body 900. The port electrode PMcr3 and the mount electrode Psr3 are connected to each other via only a via-electrode VHr3. With this configuration, the port electrode PMcr3 and the mount electrode Psr3 are connected to each other at the shortest distance along the stacking direction, and thus, unnecessary electromagnetic coupling and electrostatic coupling are less likely to occur with respect to another circuit element. In combination with the above-described configuration in which the port electrode PMct3 provided for the third transmission signal and the mount electrode Pst3 are connected to each other via only the via-electrode VHt3, the transmission circuit and the reception circuit for the third communication signal are greatly separated from each other, and unnecessary electromagnetic coupling and electrostatic coupling are more reliably significantly reduced or prevented. Accordingly, a high degree of isolation is achieved between the transmission circuit and the reception circuit for the third communication signal.

Also, ground port electrodes PMGND are provided in a center region of the fourteenth layer in a plan view, between the port electrodes PMct1, PMct2, and PMct3 and the port electrodes PMcr1, PMcr2, and PMcr3. Accordingly, a high degree of isolation between the transmission circuit and the reception circuit is achieved also on the mount surface.

According to the above-described preferred embodiments, the port electrode and the mount electrode to be connected are preferably connected to each other via only a via-electrode. Alternatively, for example, routing may be performed using a certain inner-layer electrode within a range corresponding to the mount region of a SAW filter in a plan view. With this configuration, a high degree of isolation between the transmission circuit and the reception circuit for the same communication signal is achieved.

The routing electrode pattern, and the arrangement pattern of mount electrodes and port electrodes of the multilayer body 900 described above in the second preferred embodiment can also be applied to the high-frequency module 10 described above in the first preferred embodiment. Accordingly, also in the high-frequency module 10 according to the first preferred embodiment, a high degree of isolation between the transmission circuit and the reception circuit in the multilayer body 900 is achieved.

In the description provided above, three duplexers are preferably used. The configuration of preferred embodiments of the present invention can also be applied to a case in which a number of duplexers other than three are provided. In a case in which a plurality of duplexers are used, a plurality of transmission-side filters defining the individual duplexers may be integrally provided in a single housing. With such integration, a high-frequency module can be reduced in size, as compared to a case in which the individual transmission-side filters are individually mounted. Also, regarding reception-side filters, a plurality of reception-side filters may be integrally provided in a single housing.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A high-frequency module comprising:
a switch element arranged to selectively connect a plurality of individual terminals to a common terminal;
a duplexer arranged to demultiplex a transmission signal and a reception signal in a single communication band; and
a multilayer body including the switch element and the duplexer amounted on a top surface of the multilayer body, electrodes for external connection ports provided on a bottom surface of the multilayer body opposite to the top surface, and electrode patterns defining the high-frequency module provided in inner layers of the multilayer body; wherein
the duplexer includes a transmission-side filter and a reception-side filter, the transmission-side filter having a pass band which is a frequency band of the transmission signal and having an attenuation band which is a frequency band of at least the reception signal, the reception-side filter having a pass band which is a frequency band of the reception signal and having an attenuation band which is a frequency band of at least the transmission signal, the transmission-side filter and the reception-side filter including individual housings;
the transmission-side filter and the reception-side filter are separately mounted on the top surface of the multilayer body;
the switch element is mounted between the transmission-side filter and the reception-side filter on the top surface of the multilayer body;
the switch element includes a power supply terminal to which a drive voltage and a control voltage are applied; and
the transmission-side filter is mounted on the top surface of the multilayer body on a side of the switch element opposite to a side of the switch element on which the power supply terminal is provided.

2. The high-frequency module according to claim 1, wherein
the electrodes for the external connection ports include an electrode for a transmission signal input port which receives the transmission signal from the outside; and
the transmission-side filter is mounted such that a transmission signal input terminal of the transmission-side filter and the electrode for the transmission signal input port overlap each other at least partially in a plan view of the multilayer body.

3. The high-frequency module according to claim 2, wherein an electrode on which the transmission signal input terminal of the transmission-side filter is mounted and the electrode for the transmission signal input port are connected to each other via only a via-electrode which is provided in the multilayer body and extends along a stacking direction of the multilayer body.

4. The high-frequency module according to claim 1, wherein
the electrodes for the external connection ports include an electrode for a reception signal output port which outputs the reception signal to the outside; and
the reception-side filter is mounted such that a reception signal output terminal of the reception-side filter and the electrode for the reception signal output port overlap each other at least partially in a plan view of the multilayer body.

5. The high-frequency module according to claim 4, wherein an electrode on which the reception signal output terminal of the reception-side filter is mounted and the electrode for the reception signal output port are connected to each other via only a via-electrode which is provide in the multilayer body and extends along the stacking direction of the multilayer body.

6. The high-frequency module according to claim 1, wherein
the duplexer includes a plurality of duplexers; and
a plurality of transmission-side filters of the plurality of duplexers are integrally provided in a single housing.

7. The high-frequency module according to claim 1, wherein
the duplexer includes a plurality of duplexers; and
a plurality of reception-side filters of the plurality of duplexers are integrally provided in a single housing.

8. The high-frequency module according to claim 1, wherein
a circuit element is mounted on the top surface of the multilayer body, the circuit element being an element which is different from the switch element and the transmission-side filter and the reception-side filter included in the duplexer; and
the circuit element is mounted between the switch element and the transmission-side filter.

9. The high-frequency module according to claim 1, further comprising a diplexer provided on the top surface of the multilayer body.

10. The high-frequency module according to claim 9, wherein the diplexer includes at least two filters that are integrally provided in a single housing.

11. The high-frequency module according to claim 1, wherein the transmission-side filter is disposed along and adjacent to one edge of the multilayer body and the reception side filter is disposed along and adjacent to another edge of the multilayer body opposite to the one edge.

12. The high-frequency module according to claim 11, wherein the switch element is mounted in an approximate center of the multilayer body between the one edge and the another edge of the multilayer body.

13. The high-frequency module according to claim 1, wherein
the duplexer includes a plurality of duplexers, each of the plurality of duplexers including a transmission-side filter and a reception-side filter;
the transmission-side filters of all of the plurality of duplexers are disposed along and adjacent to one edge of the multilayer body and the reception side filters of all of the plurality of duplexers are disposed along and adjacent to another edge of the multilayer body opposite to the one edge.

14. The high-frequency module according to claim 13, wherein
the transmission-side filters of all of the plurality of duplexers are disposed in a first single housing; and
the reception-side filters of all of the plurality of duplexers are disposed in a second single housing that is separated from the first single housing.

15. The high-frequency module according to claim 13, wherein the switch element is disposed on the top surface of the multilayer body along the straight line which connects the transmission-side filter and the reception-side filter of a first duplexer of the plurality of duplexers and along a straight line which connects the transmission-side filter and the reception-side filter of a second duplexer of the plurality of duplexers.

16. The high-frequency module according to claim 1, wherein the switch element is disposed on the top surface of the multilayer body along the straight line which connects the transmission-side filter and the reception-side filter of the duplexer.

17. The high-frequency module according to claim 8, wherein the circuit element includes at least one inductor and/or at least one resistor.

18. The high-frequency module according to claim 8, wherein the circuit element is a matching circuit.

19. The high-frequency module according to claim 1, wherein each of the transmission-side filter and the reception-side filter is a surface acoustic wave filter.

\* \* \* \* \*